(12) United States Patent
Ng et al.

(10) Patent No.: US 7,265,488 B2
(45) Date of Patent: Sep. 4, 2007

(54) LIGHT SOURCE WITH WAVELENGTH CONVERTING MATERIAL

(75) Inventors: Kee Yean Ng, Penang (MY); Kheng Leng Tan, Penang (MY); Tajul Arosh Baroky, Penang (MY); Janet Bee Yin Chua, Perak (MY); Kok Chin Pan, Penang (MY)

(73) Assignee: Avago Technologies General IP Pte. Ltd, Singapore (SG)

( * ) Notice: Subject to any disclaimer, the term of this patent is extended or adjusted under 35 U.S.C. 154(b) by 96 days.

(21) Appl. No.: 10/954,399

(22) Filed: Sep. 30, 2004

(65) Prior Publication Data

US 2006/0066210 A1 Mar. 30, 2006

(51) Int. Cl.
*H01J 1/62* (2006.01)

(52) U.S. Cl. .................. 313/501; 313/502; 313/503

(58) Field of Classification Search ............... 313/486, 313/487, 498, 501–503
See application file for complete search history.

(56) References Cited

U.S. PATENT DOCUMENTS

| | | | |
|---|---|---|---|
| 5,811,924 A * | 9/1998 | Okumura et al. ........... 313/487 |
| 2003/0127660 A1* | 7/2003 | Bawendi et al. .............. 257/89 |
| 2003/0227249 A1* | 12/2003 | Mueller et al. ............ 313/491 |
| 2005/0001533 A1* | 1/2005 | Huber et al. ................ 313/485 |
| 2005/0006659 A1* | 1/2005 | Ng et al. ...................... 257/99 |

* cited by examiner

*Primary Examiner*—Joseph Williams
*Assistant Examiner*—Bumsuk Won

(57) ABSTRACT

A light emitting device in which a primary light generator, such as a light emitting diode (LED) or laser diode, is operable to emit a primary light that is received by a body of wavelength converting material. A portion of the primary light is absorbed by the body of wavelength converting material and is emitted as secondary light. The wavelength converting material contains phosphor nano-particles and larger phosphor particles. The phosphor nano-particles prevent transmission of primary light while the larger phosphor particles provide efficient light conversion.

14 Claims, 2 Drawing Sheets

LIGHT SOURCE WITH WAVELENGTH CONVERTING MATERIAL

FIELD

This invention relates generally to the field of light sources. More particularly, this invention relates to LED or laser diode light sources employing light converting materials.

BACKGROUND

LED (light emitting diode) light sources sometimes employ phosphor materials to alter the wavelength of the light emitted by the LED. For example, a blue LED may be used with a yellow phosphor. The yellow phosphor absorbs some of the primary blue light from the LED and re-emits it as secondary yellow light. The yellow light combines with the unabsorbed blue light to form white light. In this example some blue light is intentionally left unconverted. This is possible because the phosphor particles are large and some of the light passes through gaps between the particles.

In a further example, an ultraviolet (UV) LED produces UV radiation that is converted by red, green and blue phosphors to form white light. In this example, it is undesirable for any of the primary UV radiation to pass through the phosphor without wavelength conversion, since the UV radiation is harmful to humans. Thus, it is important that leakage of UV radiation is minimized.

One way to reduce UV radiation leakage is to increase the thickness of the wavelength converting material. However, such light sources are inefficient, since some of the secondary (red, green and blue) radiation is reabsorbed by the phosphor.

Another way to reduce UV radiation leakage is to use smaller phosphor particles so that they can be closely packed together to reduce gaps between particles. Again, the conversion efficiency is reduced because smaller phosphor particles have inherently poorer light conversion efficiency.

BRIEF DESCRIPTION OF THE DRAWINGS

The novel features believed characteristic of the invention are set forth in the appended claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
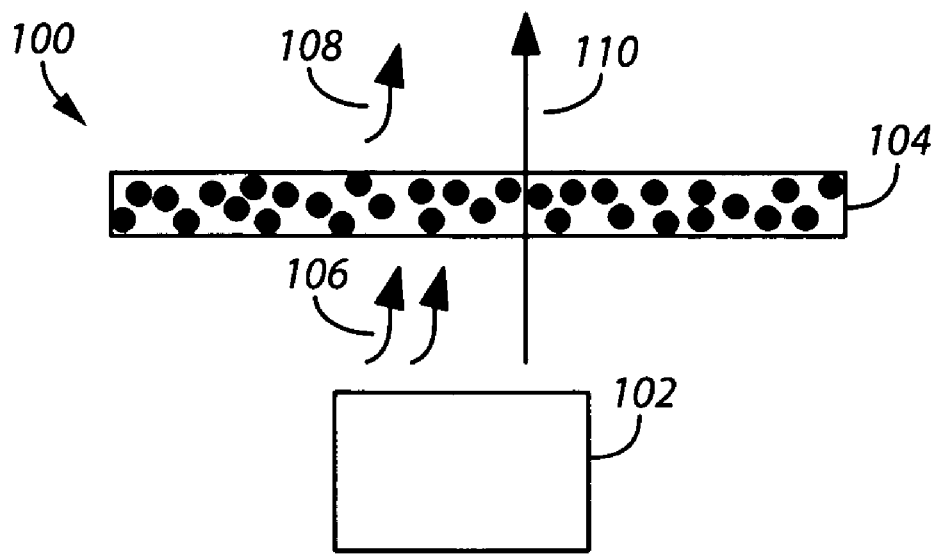
FIG. 1 is a representation of a light source of the prior art.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The present invention relates to a light source employing a primary light generator, such as an LED (light emitting diode) or a laser diode, and a wavelength converting material. The light source may be used to generate light having a mixture of wavelengths and, in particular, may be used to generate white light. The wavelength converting material uses both phosphor particles and phosphor nano-particles. This results in a substantial reduction of the leakage of primary radiation from the primary light generator through the wavelength converting material. In addition, since the light converting ability of nano-particles is a function of their size, the secondary radiation has an extended spectral bandwidth. A nano-particle is taken to be a particle with a size less than 1I m. The invention has application to a light source in which the primary radiation is ultraviolet (UV) radiation. UV radiation is harmful to humans, so it is important that leakage of UV radiation is minimized. The light source of the present invention does not allow any significant UV radiation to escape, since substantially all of the UV light is absorbed by the wavelength converting material. In one embodiment of the invention, greater than 80% of the UV radiation is absorbed in the body of wavelength converting material. In a further embodiment of the invention, greater than 90% of the UV radiation is absorbed in the body of wavelength converting material. The amount of absorption of the UV radiation is determined by the thickness of the wavelength converting material and the size of the phosphor particles and phosphor nano-particles.

A light source of the prior art is shown in FIG. 1. Referring to FIG. 1, the light source 100 has an LED semiconductor die 102 and layer of big particle phosphor 104. A portion 106 of the primary light from the LED semiconductor die is absorbed by the big particle phosphor layer 104 and re-emitted as secondary light 108 with an altered wavelength. Another portion 110 of the primary light is transmitted through the layer without wavelength conversion.

Figure 2:
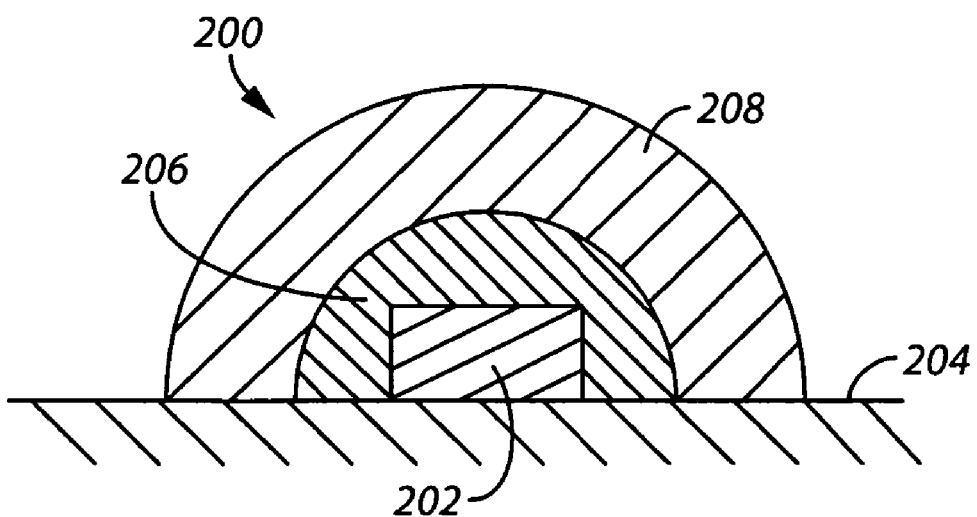
FIG. 2 is a representation of a light source in accordance with a first embodiment of the present invention.

One embodiment of a light source of the present invention is shown in FIG. 2. Referring to FIG. 2, the light source 200 has a primary light generator 202, such as an LED semiconductor die or laser diode, that is located on substrate 204. Enclosing the primary light generator 202 are a first layer of wavelength converting material 206 and a second layer of wavelength converting material 208. The layers of wavelength converting material have different wavelength converting properties. The different wavelength converting properties are achieved by using different size particles of phosphor. In particular, nano-particles of phosphor can be used together with larger phosphor particles. The nano-particles prevent leakage of primary radiation from the primary light generator 202, while the larger phosphor particles provide efficient wavelength conversion.

In this embodiment, the layers of wavelength converting material are applied as coatings on the primary light generator 202.

In a further embodiment, one or more additional layers of wavelength converting material are used.

In a still further embodiment, the phosphor nano-particles and larger phosphor particles are mixed together and applied as a single coating.

Figure 3:
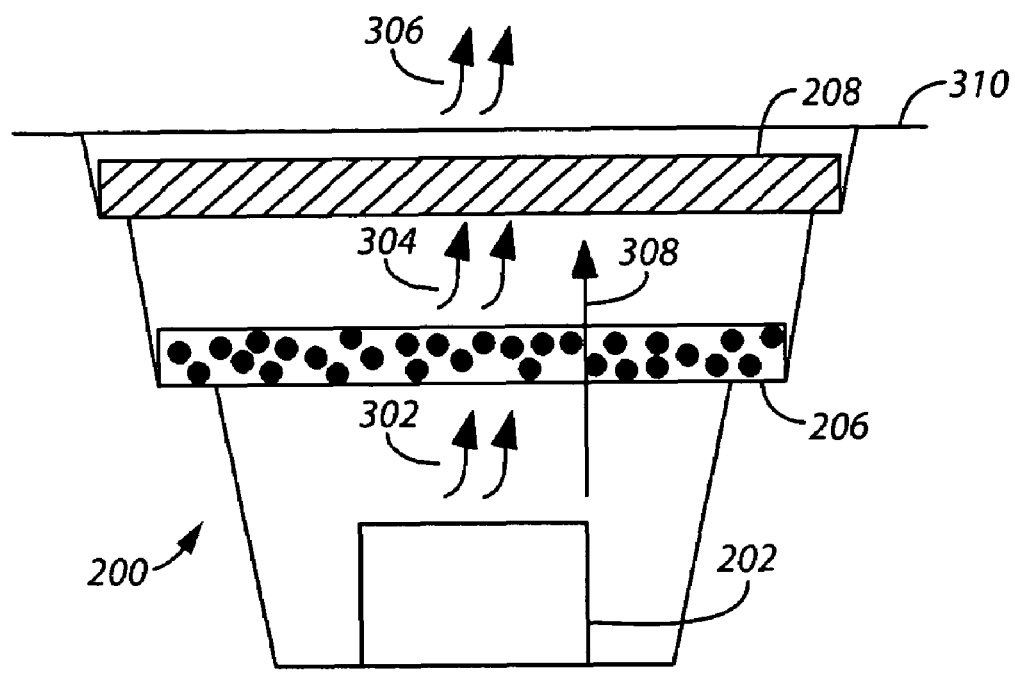
FIG. 3 is a representation of a light source in accordance with a second embodiment of the present invention.

A further embodiment of a light source of the present invention is shown in FIG. 3. Referring to FIG. 3, the light source 200 has a primary light generator 202 that emits primary light 302. The primary light 302 is absorbed by a first layer of wavelength converting material 206. Secondary light 304 is emitted from the first layer of wavelength converting material 206 and is received by a second layer of wavelength converting material 208. Tertiary light 306 is emitted from the second layer of wavelength converting material 208. The tertiary light combines with any secondary light that is transmitted through the second layer of wavelength converting material to form the light radiated from the light source. In one example of this embodiment, the first layer of wavelength converting material 206 contains phosphor particles, while the second layer contains phosphor nano-particles. In this example, a portion 308 of the primary light passes through the first layer of wavelength converting material 206, but is absorbed by the second layer of wavelength converting material 208. This arrangement also prevents the phosphor particles from absorbing the light emitted by the phosphor nano-particles.

The first and second layer of wavelength converting material, 206 and 208 respectively, may be supported on ledges or grooves in the reflector cup 310. Alternatively, the layers may be in contact with one another and supported by a single ledge.

Figure 4:
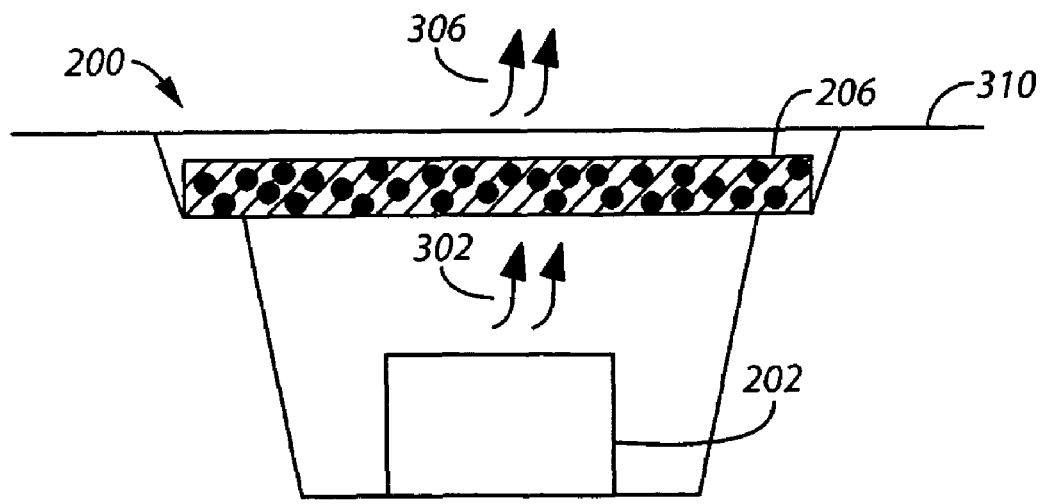
FIG. 4 is a representation of a light source in accordance with a third embodiment of the present invention.

A still further embodiment of a light source of the present invention is shown in FIG. 4. Referring to FIG. 4, the light source 200 has a primary light generator 202 that emits primary light 302. The primary light 302 is absorbed by a layer of wavelength converting material 206 that contains a mixture of phosphor particles and phosphor nano-particles. All of the primary radiation 302 from the primary light generator 202 is absorbed by the layer of wavelength converting material 206 because the phosphor nano-particles fill the spaces between the larger phosphor particles and block transmission. Excitation of the layer wavelength converting material 206 by the primary radiation causes secondary radiation to the emitted from the layer. The phosphor nano-particles are packed in the interstices between the bigger phosphor particles. Thus, all of the primary radiation is absorbed without having to increase the thickness of the layer of wavelength converting material.

In FIG. 4, the layer of wavelength converting material 206 is shown in close proximity to the primary light generator 202. In a still further embodiment of the invention, the layer of wavelength converting material 206 is applied as a coating to the primary light generator 202. The wavelength converting material can envelop the primary light generator 202 in a variety of shapes. It may be shaped as a hemisphere, cube or pyramid, for example, and may be shaped to optimize the optical properties of the light source.

The layer of wavelength converting material 206 may be supported on a ledge or groove in the reflector cup 310.

In one embodiment of the invention, the phosphor particles have a mean size greater than 2 μm, and the phosphor nano-particles have a mean size less than 1 μm.

In a further embodiment of the invention, the phosphor particles have an mean size greater than 5 μm, and the phosphor nano-particles have a mean size less than 0.1 μm.

Wavelength conversion by phosphor nano-particles is performed by a different mechanism to wavelength conversion by larger phosphor particles. Although phosphor nano-particles are of the order of nanometers in size, different particle sizes convert light to different wavelengths. Hence, by using nano-particles of different sizes, a range of wavelengths of secondary radiation can be achieved. In particular, the size and mixture of particles may be controlled to give specific wavelength conversion properties.

The phosphor particles and phosphor nano-particles may be suspended in an optically clear medium, such as epoxy, silicone or glass. The optically clear medium may be organic or non-organic.

The nano-particles may be nano-crystals or quantum dots.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for generating visible light, comprising:
  a) generating primary light using a light-emitting semiconductor device;
  b) receiving the primary light with a first body of wavelength converting material;
  c) absorbing a first portion of the primary light by a plurality of phosphor particles in the first body of wavelength converting material and emitting secondary light while transmitting a second portion of the primary light;
  d) receiving the secondary light and the second portion of the primary light with a second body of wavelenoth converting material;
  e) absorbing the second portion of the primary light by a plurality of phosphor nano-particles in the second body of wavelength converting material and emitting tertiary light; and
  f) transmitting the secondary light through the second body of wavelength converting material;
wherein the secondary light and the tertiary light combine to form white light.

2. The light-emitting device of claim 1, wherein the larger phosphor particles have a mean size greater than 5 μm, and the phosphor nano-particles have a mean size less than 0.1 μm.

3. The light-emitting device of claim 1, wherein the larger phosphor particles have a mean size greater than 5 μm, and the phosphor nano-particles have a mean size less than 0.1 μm.

4. The light-emitting device of claim 1, wherein the phosphor nano-particles comprise quantum dots.

5. The light-emitting device of claim 1, wherein the primary light is ultraviolet light.

6. The light-emitting device of claim 1, wherein the light-emitting semiconductor device is selected form the group consisting of an LED and a laser diode.

7. The light emitting device of claim 1, wherein the light-emitting semiconductor device is a blue LED.

8. A light emitting device comprising:
  A light-emitting semiconductor device operable to emit a primary light having an ultraviolet component;
  a first coating converting material applied to a surface of the light-emitting semiconductor device and operable to receive at least a portion of the primary light and emit a secondary light in response; and
  a second coating of wavelength converting material applied to the first coating of wavelength converting material and operable to reduce radiation of the primary light and to transmit the secondary light;
  wherein the first coating of wavelength converting material comprises phosphor particles having a mean size greater than 2 μm, and the second coating of wavelength converting material comprises phosphor nano-particles having a mean size less than 1 μm, the second coating of wavelength converting material being operable to convert the primary light into tertiary light, the second and tertiary lights combining to form white light.

9. The light-emitting device of claim 8, wherein the larger phosphor particles have a mean size greater than 5 μm, and the phosphor nano-particles have a mean size less than 0.1 μm.

10. The light-emitting device of claim 8, wherein the larger phosphor particles have a mean size greater than 5 μm, and the phosphor nano-particles have a mean size less than 0.1 μm.

11. The light-emitting device of claim 8, wherein the phosphor nano-particles comprise quantum dots.

12. The light-emitting device of claim 8, wherein the primary light is ultraviolet light.

13. The light-emitting device of claim 8, wherein the light-emitting semiconductor device is selected form the group consisting of an LED and a laser diode.

14. The light emitting device of claim 8, wherein the light-emitting semiconductor device is a blue LED.

* * * * *

UNITED STATES PATENT AND TRADEMARK OFFICE
CERTIFICATE OF CORRECTION

PATENT NO.        : 7,265,488 B2                                Page 1 of 1
APPLICATION NO.   : 10/954399
DATED             : September 4, 2007
INVENTOR(S)       : Kee Ng It is certified that error appears in the above-identified patent and that said Letters Patent is hereby corrected as shown below:

Col. 4 Line 26 In Claim 1, delete "wavelenoth" and insert -- wavelength --, therefor.

Col. 4 Line 34 In Claim 1, delete "tertiary light" and insert -- tertiary lights --, therefor.

Col. 4 Line 49 In Claim 6, delete "form" and insert -- from --, therefor.

Col. 4 Line 56 In Claim 8, after "coating" insert -- of wavelength --.

Col. 5 Line 3 In Claim 8, after "convert" delete "the".

Col. 6 Line 7 In Claim 13, delete "form" and insert -- from --, therefor.

Signed and Sealed this

Twenty-fourth Day of February, 2009

JOHN DOLL
*Acting Director of the United States Patent and Trademark Office*